(12) United States Patent
Fukumori et al.

(10) Patent No.: US 7,268,827 B2
(45) Date of Patent: Sep. 11, 2007

(54) CIRCUIT FOR TRANSFERRING A TIMING SIGNAL BETWEEN CIRCUITS HAVING DIFFERENT CLOCK FREQUENCIES

(75) Inventors: Hiroyuki Fukumori, Tokyo (JP); Eifuu Nezu, Tokyo (JP); Kenji Suzuki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 1258 days.

(21) Appl. No.: 10/156,209

(22) Filed: May 28, 2002

(65) Prior Publication Data

US 2002/0181934 A1 Dec. 5, 2002

(30) Foreign Application Priority Data

May 31, 2001 (JP) ............................. 2001-164881

(51) Int. Cl.
  *H03L 7/00* (2006.01)
  *H04N 9/475* (2006.01)
(52) U.S. Cl. ...................... 348/537; 348/501; 348/516; 348/194
(58) Field of Classification Search ................ 348/500, 348/501, 510, 516, 536, 537, 194, 497; 375/354, 375/357, 362, 371; 327/141, 144, 145, 146, 327/151, 155, 160; 713/375, 400, 500, 501, 713/503, 600; 386/66
See application file for complete search history.

(56) References Cited

U.S. PATENT DOCUMENTS

| | | | |
|---|---|---|---|
| 4,942,471 A | * | 7/1990 | Chikuma et al. ........... 348/634 |
| 4,964,109 A | * | 10/1990 | Yoshioka .................. 369/44.29 |
| 5,774,701 A | * | 6/1998 | Matsui et al. ................ 713/501 |
| 5,881,113 A | * | 3/1999 | Lee ............................. 375/354 |
| 6,175,603 B1 | * | 1/2001 | Chapman et al. ........... 375/354 |
| 6,215,948 B1 | * | 4/2001 | Watanabe et al. ............. 386/38 |

FOREIGN PATENT DOCUMENTS

| JP | 01-144738 | 6/1989 |
|---|---|---|
| JP | 05-327684 | 12/1993 |

OTHER PUBLICATIONS

English Bibliographies and Abstracts of JP 05-327684, and JP 01-144738 (cited above).

\* cited by examiner

*Primary Examiner*—Victor R. Kostak
(74) *Attorney, Agent, or Firm*—Daryl G. Walker

(57) ABSTRACT

A timing signal transferring circuit (10) that may be arranged to stably transfer a timing signal (S1) between two video signal processing circuits that may operate at different clock frequencies has been disclosed. A first timing signal (S1) may be received from a pre-stage video processing circuit (13). The first timing signal (S1) may be synchronous with a pre-stage system clock (C1) and may be set to the vicinity of a center of a screen by a video signal. A second timing signal (S2) may be generated on the basis of first timing signal (S1) and transferred to a post-stage video signal processing circuit (14). Second timing signal (S2) may be synchronous with a post-stage system clock (C2). In this way, a disturbance or distortion of a video on a screen due to a difference in system clock frequency affecting a video signal in the post-stage circuit may be reduced or eliminated.

18 Claims, 3 Drawing Sheets

CIRCUIT FOR TRANSFERRING A TIMING SIGNAL BETWEEN CIRCUITS HAVING DIFFERENT CLOCK FREQUENCIES

TECHNICAL FIELD

The present invention relates generally to a timing signal transferring circuit, and more particularly to a technique for transferring a timing signal to a post-stage circuit from a pre-stage circuit of video signal processing circuits that may have different system clock frequencies.

BACKGROUND OF THE INVENTION

In video applications, a timing signal can be transferred between two video processing circuits with each video processing circuit having a system clock with a different frequency. For example, a timing signal can be transferred between a pre-stage circuit (in a first video processing circuit) to a post-stage circuit (in a second video processing circuit. Because the phases of the system clocks in the video signal processing circuits are different from each other, the timing signal that is synchronous with the system clock in the pre-stage circuit always jitters in the post-stage circuit when the timing signal remains in a state at the time of being transferred.

Therefore, when a video signal is processed in the post-stage circuit using the jittering timing signal as a reference signal, a horizontal synchronous signal and a vertical synchronous signal in the video signal can become unstable and a distortion of a picture on a screen obtained by the video signal may occur.

For that reason, when a timing signal is transferred between two video signal processing circuits having different system clock frequencies, a PLL (phase locked loop) circuit corresponding to each of the system clocks is assembled in each of the pre-stage circuit and the post-stage circuit in order to obtain a stable timing signal in each of the pre-stage circuit and post-stage circuit to prevent picture distortions on the screen.

Japanese Patent Application Laid-open No. Hei 5-327684 (JPA 5-327684) discloses a timing circuit in which a PLL circuit is disposed in each of the circuits with differing system clock frequencies in order to ensure a proper transfer of a timing signal.

Also, in order to protect an unstable synchronous signal, Japanese Patent Application Laid-open No. Hei 01-144738 (JPA 01-144738) discloses a window method synchronization protecting circuit. In this case, a detection temporal window is set to absorb jitter within a period of the detection window.

However, the above-mentioned timing circuit and window method synchronization can include the following problems.

For example, in the timing circuit disclosed in JPA 5-327648, overall circuit area can become large because a PLL circuit is assembled in each of the circuits having a different system clock frequency. This can increase production costs.

Also, in the window method synchronization circuit disclosed in JPA 01-144738, when a timing signal is set at the upper portion or the lower portion of the screen, AFC (automatic frequency control) is unstable on an upper portion of a screen due to a video signal in the pre-stage circuit and a large jitter may occur on the lower portion of the screen for changing over a head when, for example, the pre-stage circuit is a VTR (video tape recorder). Thus, it can be difficult to stably transfer the timing signal even by the window method synchronization protecting circuit.

In view of the above discussion, it would be desirable to provide a timing signal transferring circuit in which a timing signal may be suitably transferred from a pre-stage circuit to a post-stage circuit of two video signal processing circuits having differing system clock frequencies with reduced distortions of a picture on a screen.

SUMMARY OF THE INVENTION

According to the present embodiments, a timing signal transferring circuit that may be arranged to stably transfer a timing signal between two video signal processing circuits that may operate at different clock frequencies is disclosed. A first timing signal may be received from a pre-stage video processing circuit. The first timing signal may be synchronous with a pre-stage system clock and may be set to the vicinity of a center of a screen by a video signal. A second timing signal may be generated on the basis of first timing signal and transferred to a post-stage video signal processing circuit. Second timing signal may be synchronous with a post-stage system clock. In this way, a disturbance or distortion of a video on a screen due to a difference in system clock frequency affecting a video signal in the post-stage circuit may be reduced or eliminated.

According to one aspect of the embodiments, a timing signal transferring circuit may be coupled between a first video signal processing circuit and a second video signal processing circuit. The first video signal processing circuit may have a first system clock. The second video signal processing circuit may have a second system clock. The first system clock may have a different frequency than the second system clock. An input terminal may be coupled to receive a first timing signal from the first video signal processing circuit. The first timing signal may be essentially synchronous with the first system clock and may be set to the vicinity of a center of a screen by a video signal. An output terminal may be coupled to provide a second timing signal to the second video signal processing circuit. The second timing signal may be essentially synchronous with the second system clock and may be generated on the basis of the first timing signal.

According to another aspect of the embodiments, the timing signal transferring circuit may include a synchronization protecting circuit and a timing signal generation circuit. The synchronization protecting circuit may subject the first timing signal transferred from the first video signal processing circuit to synchronous protection with the second system clock as an operation clock. The timing signal generation circuit may be coupled to generate a second timing signal. The second timing signal may be essentially synchronous with the second system clock and may be generated on the basis of the first timing signal and the second system clock to transfer the second timing signal to the second video signal processing circuit.

According to another aspect of the embodiments, the synchronization protecting circuit may translate the first timing signal to a translated signal that may be essentially synchronous with the second system clock.

According to another aspect of the embodiments, the synchronization protecting circuit may include a clock counter that can provide a clock counter signal that may be essentially synchronous with the second system clock.

According to another aspect of the embodiments, the timing signal generating circuit may generate the second timing signal on the basis of at least the translated signal.

According to another aspect of the embodiments, the synchronization protecting circuit may conduct the synchronous protection of the first timing signal by using a detection window.

According to another aspect of the embodiments, a timing signal transferring circuit may include a synchronization protecting circuit and a timing signal generating circuit. The synchronization protecting circuit may be coupled to receive a first timing signal and generate a synchronization protecting circuit output signal. The first timing signal may be essentially synchronous with a first system clock. The timing signal generating circuit may be coupled to receive the synchronization protecting circuit output signal and may generate a second timing signal. The second timing signal may be essentially synchronous with a second system clock. The first system clock may have a different frequency than the second system clock.

According to another aspect of the embodiments, the synchronization protecting circuit may be coupled to receive the second system clock.

According to another aspect of the embodiments, the synchronization protecting circuit may include a detection window generating circuit. The detection window generation circuit may be coupled to receive the synchronization protecting circuit output and may provide a detection window. The detection window may be essentially centered at a timing of the second timing signal.

According to another aspect of the embodiments, the synchronization protecting circuit may further include a disagreement counter. The disagreement counter may be incremented when the first timing signal has a predetermined logic level out of the detection window.

According to another aspect of the embodiments, the disagreement counter may be reset when the first timing signal has a predetermined logic level within the detection window.

According to another aspect of the embodiments, the detection window may be shifted after a predetermined consecutive number of times the first timing signal has a predetermined logic level outside of the detection window.

According to another aspect of the embodiments, the first system clock may be used for a first video processing circuit and the second system clock may be used for a second video processing circuit.

According to another aspect of the embodiments, a timing signal transferring circuit may include a synchronization protecting circuit. The synchronization protecting circuit may be coupled to receive a first timing signal. The first timing signal may be essentially synchronous with a first system clock. The synchronization protecting circuit may provide a second timing signal. The second timing signal may be essentially synchronous with a second system clock. The first system clock may have a different frequency than the second system clock.

According to another aspect of the embodiments, the first timing signal may be provided by a first video signal processing circuit operating from the first system clock. The second timing signal may be provided to a second video signal processing circuit operating from the second system clock.

According to another aspect of the embodiments, the first system clock may be set to the vicinity of a center of a screen.

According to another aspect of the embodiments, the synchronization protecting circuit may include a detection window generating circuit. The detection window generating circuit may be coupled to receive the second timing signal and may provide a detection window essentially centered at a timing of the second timing signal.

According to another aspect of the embodiments, the synchronization protecting circuit may detect whether the first timing signal has a predetermined logic level inside the detection window.

According to another aspect of the embodiments, the synchronization protecting circuit may include a first counter. The first counter may be reset to an initial count value if the first timing signal has a predetermined logic level within a detection window.

According to another aspect of the embodiments, the synchronization circuit may include a second counter. The second counter may be coupled to receive the second system clock.

According to another aspect of the embodiments, the synchronization protecting circuit may include a pulse width changing circuit. The pulse width changing circuit may be coupled to receive the first timing signal and may provide a modified pulse width signal.

DETAILED DESCRIPTION OF THE EMBODIMENTS

Various embodiments of the present invention will now be described in detail with reference to a number of drawings.

Figure 1:
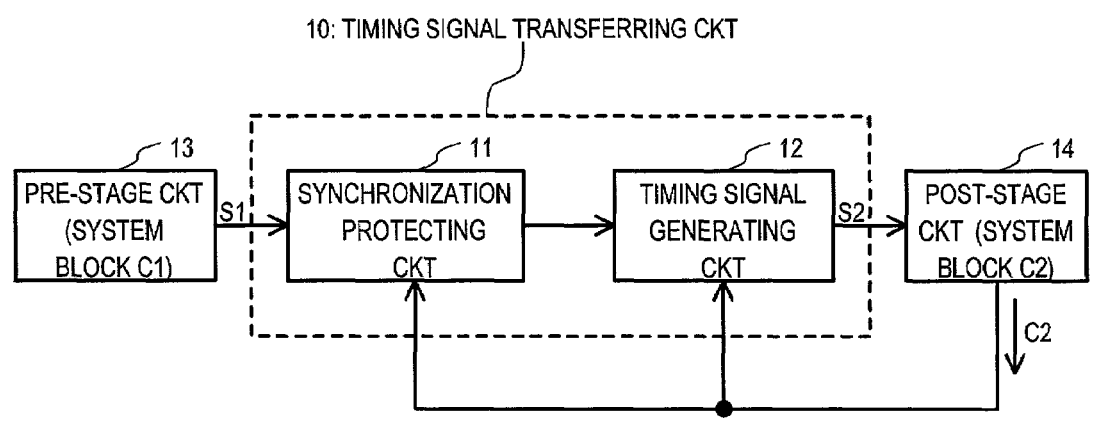
FIG. 1 is a block schematic diagram showing a timing signal transferring circuit according to an embodiment that transfers a timing signal between a pre-stage circuit and a post-stage circuit.

Referring now to FIG. 1, a block schematic diagram is set forth that shows a timing signal transferring circuit according to an embodiment. A timing signal transferring circuit can transfer a timing signal between a pre-stage circuit and a post-stage circuit. Timing signal transferring circuit 10 may receive a first timing signal S1 from a pre-stage video signal processing circuit (hereafter referred to as a pre-stage circuit) 13 and a system clock (hereafter referred to as a post-stage system clock) C2 from a post-stage video signal processing circuit (hereafter referred to as a post-stage circuit) 14. Timing signal transferring circuit 10 may provide a second timing signal S2 to an input of post-stage circuit 14.

Timing signal transferring circuit 10 may include a synchronization protecting circuit 11 and a timing signal generation circuit 12.

Synchronization protecting circuit 11 may be structured to synchronously protect first timing signal S1. First timing signal S1 may be synchronous with a system clock C1 (hereafter referred to as pre-stage system clock) of pre-stage circuit 13 and may be transferred from pre-stage circuit 13 with a post-stage system clock C2 of post-stage circuit 14 as an operation clock.

In this example, first timing signal S1 may be set to the vicinity of a center of a screen by a video signal in pre-stage circuit 13. That is, first timing signal S1 may be set to the vicinity of the center below approximately 10% of an upper portion of the screen where the AFC (automatic frequency control) may be stable and above a lower portion of the screen where a timing may shift due to a head change-over in a screen due to the video signal. The head change-over may occur when pre-stage circuit 13 is a VTR, for example.

As a result, first timing signal S1 may be stably input to synchronization protecting circuit 11 when transferred to timing signal transferring circuit 10 according to the embodiment.

Timing signal generating circuit 12 may generate a second timing signal S2. Second timing signal S2 may be generated by timing signal generating circuit 12 from first timing signal S1 and post-stage system clock C2. Timing signal S1 may be protected by synchronization protecting circuit 11. Timing signal S2 may be synchronous with post-stage system clock C2.

Figure 2:
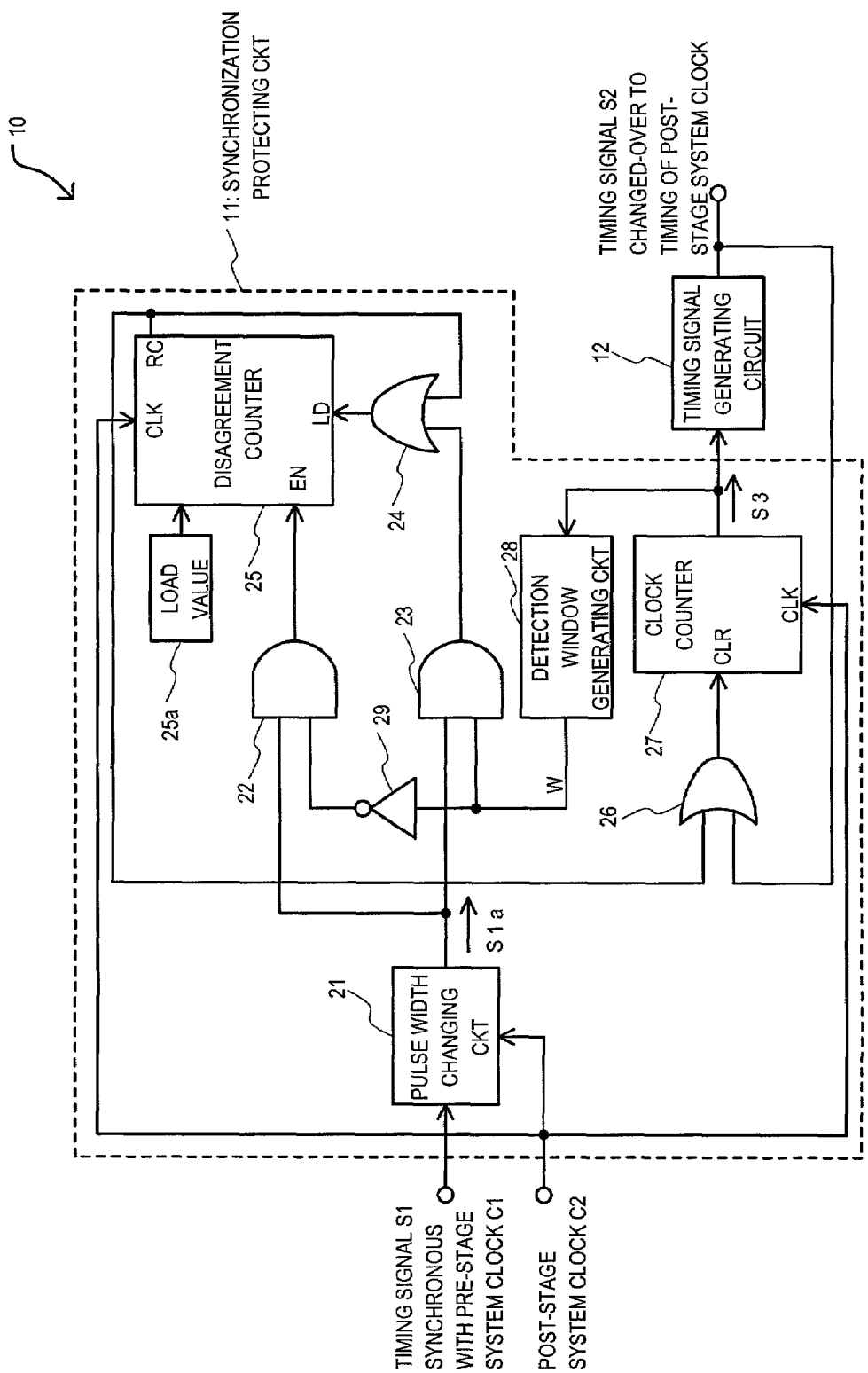
FIG. 2 is a circuit schematic diagram of a timing signal transferring circuit according to an embodiment.

Synchronization protecting circuit 11 will now be discussed in more detail with reference to FIG. 2. Referring now to FIG. 2, a circuit schematic diagram of timing signal transferring circuit 10 according to an embodiment is set forth.

FIG. 2 illustrates a detailed circuit schematic diagram of synchronization protecting circuit 11.

Synchronization protecting circuit 11 may include a pulse width changing circuit 21, AND gates (22 and 23), OR gates (24 and 26), a disagreement counter 25, a clock counter 27, a detection window generating circuit 28, and an inverter 29.

Pulse width changing circuit 21 may receive first timing signal S1 and post-stage system clock C2 and may output a signal S1*a*. AND gate 22 may receive signal S1*a* at one input and may have another input connected to an output of inverter 29 and may provide an output signal to an enable terminal EN of disagreement counter 25. AND gate 23 may receive signal S1*a* at one input and a signal W (from detection window generating circuit 28) at another input and may provide an output to an input of OR gate 24. OR gate 24 may receive an output from a ripple carry terminal RC of disagreement counter 25 at another input and may provide an output to a load terminal LD of disagreement counter 25. Disagreement counter 25 may receive a load value 25*a* as an input and post-stage system clock C2 and provides an output at ripple carry terminal RC. OR gate 26 may receive an output from ripple carry terminal RC of disagreement counter 25 and second timing signal S2 as inputs and provides an output to a clear terminal CLR of clock counter 27. Clock counter 27 may receive post-stage system clock C2 at a clock terminal CLK and may provide a signal S3 as an output. Detection window generating circuit 28 may receive signal S3 as an input and may provide a signal W as an output. Inverter 29 may receive signal W as an input.

First timing signal S1 may be provided to pulse width changing circuit 21 in synchronism with pre-stage system clock C1 of pre-stage circuit 13. Pulse width changing circuit 21 may receive post-stage system clock C2 from post-stage circuit 14 (FIG. 1). Pulse width changing circuit 21 may generate a signal S1*a* based on pre-stage system clock C1 and having a period width that may be essentially a period width of post-stage system clock C2. AND gates (22 and 23) may, respectively, receive signal S1*a* at an input terminal.

Disagreement counter 25 may load a value of load value 25*a* as an initial value when an output of AND gate 23 goes high. In this way, OR gate 24 may provide a high logic level to a load terminal LD of disagreement counter 25.

Disagreement counter 25 may count a high logic level output signal of AND gate 22. When a count value in disagreement counter 25 becomes a maximum, disagreement counter 25 may output a signal from ripple carry terminal RC. The signal from ripple carry terminal RC may be applied as an input to OR gate 24. When the signal from ripple carry terminal RC goes high, OR gate 24 may apply a high logic level to load terminal LD of disagreement counter 25 and a value of load value 25*a* may be loaded into disagreement counter 25.

Also, when the signal from ripple carry terminal RC goes high, OR gate 24 may apply a high logic level to a clear terminal CLR of clock counter 27 and clock counter 27 may output a signal S3 to timing signal generating circuit 12 and detection window generating circuit 28.

Detection window generating circuit 28 may generate a window (signal W). Window (signal W) may be within a range that may protect first timing signal S1 that may be synchronous with pre-stage system clock C1. A temporal position of output signal S2 of timing signal generation circuit 12 may serve as a window center on the basis of signal S3 from clock counter 27.

The operation of timing signal transferring circuit 10 will now be described with reference to FIG. 3 in conjunction with FIG. 2.

Figure 3:
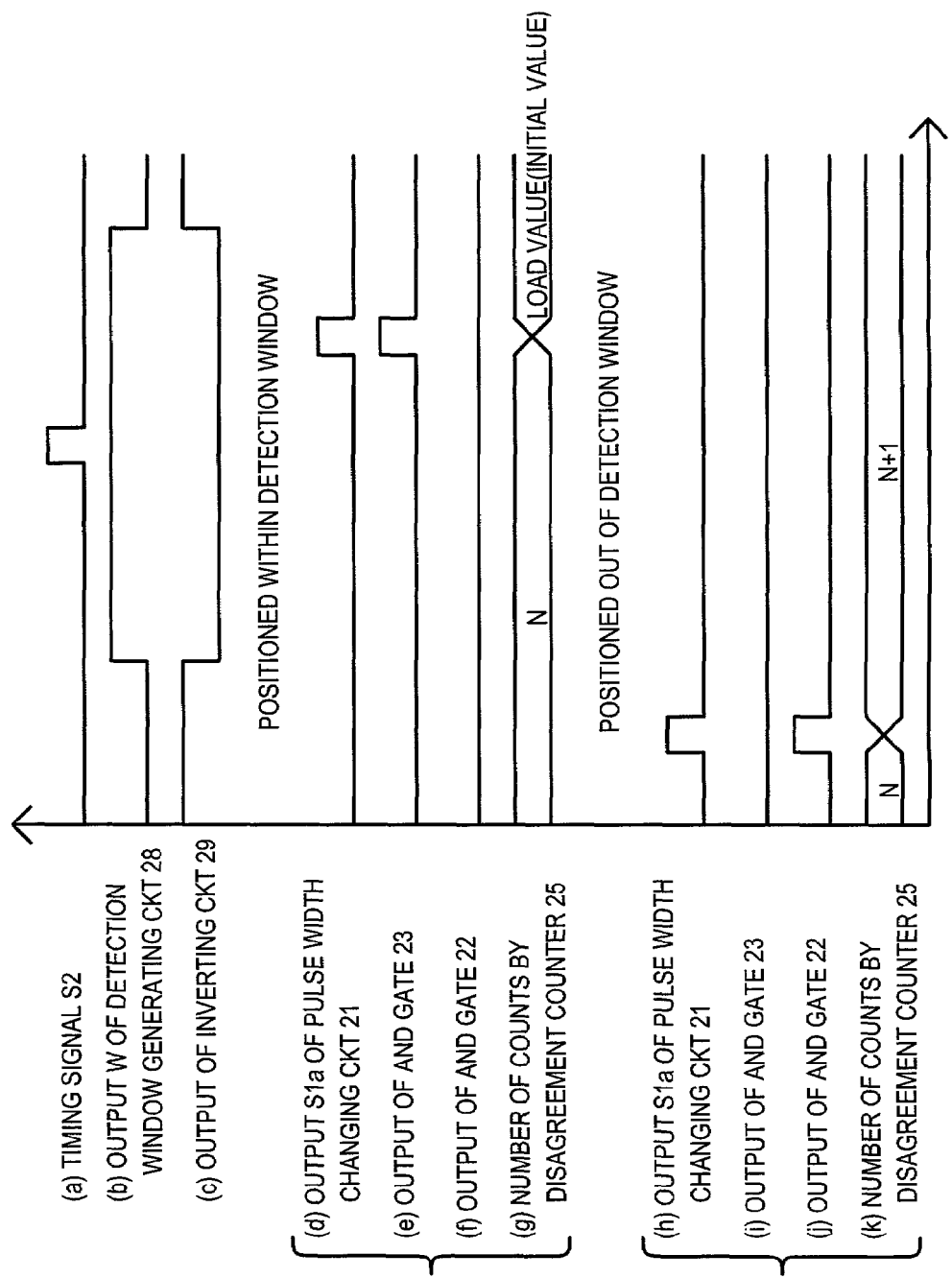
FIG. 3 is a timing diagram showing signals of timing signal transfer circuit of FIG. 2 according to an embodiment.

FIG. 3 is a timing diagram showing signals of timing signal transfer circuit 10 of FIG. 2.

FIG. 3 illustrates logic waveforms for timing signal S2, an output W of detection window circuit 28, an output of inverter 29, an output S1*a* of pulse width changing circuit 21, an output of AND gate 23, an output of AND gate 22, a number of counts by disagreement counter 25 for a case where first timing signal S1 is positioned within detection window (signal W) and a case where first timing signal S1 is positioned out of detection window (signal W).

First, in a normal state, clock counter 27 may operate in synchronism with post-stage system clock C2 and may be self-reset (cleared) by second timing signal S2 (refer to waveform (a) in FIG. 3) from timing signal generating circuit 12.

Timing signal generating circuit 12 may decode, for example, signal S3 provided from clock counter 27 to a decoded value that may be suited for post-stage system clock C2. Timing signal generating circuit 12 may send out the decoded value to OR gate 26 and to a post-stage circuit 14 (FIG. 1) as second timing signal S2 translated to the timing of post-stage system clock C2.

In this example, in order to protect first timing signal S1 that is synchronous with pre-stage system clock C1, synchronization protecting circuit 11 may reset clock counter 27 as will now be explained.

First timing signal S1 may be input to pulse width changing circuit 21 of synchronization protecting circuit 11 and may be modified to have essentially a period width of post-stage system clock C2 to provide signal S1*a* (refer to waveforms (d) and (h) of FIG. 3). Signal S1*a* may be provided to a respective input terminal of AND gates (22 and 23).

In this example, signal W (refer to waveform (b) of FIG. 3) may be provided to the other input terminal of AND gate 22 from detection window generation circuit 28. A center timing of signal W may essentially correspond with second timing signal S2 (refer to waveform (a) of FIG. 3) from timing signal generating circuit 12. An inverted signal W may also be provided to the other input terminal of AND gate 23 from detection window generation circuit 23 through inverter 29 (refer to waveform (c) of FIG. 3).

AND gates (22 and 23) may respectively provide outputs based on a logic AND of respective input signals.

AND gate 23 may output a signal (refer to waveform (e) of FIG. 3) when output signal S1*a* (refer to waveform (d) of FIG. 3) is positioned within detection window W (refer to waveform (b) of FIG. 3) generated by detection window generating circuit 28. However, when output signal S1*a* (refer to waveform (h) of FIG. 3) is positioned out of detection window W generated by detection window generating circuit 28, AND gate 23 may not output a signal (refer to waveform (i) of FIG. 3). When the output W of detection window generating circuit 28 is high (timing within detection window), AND gate 23 may be enabled. When the output W of detection window generating circuit 28 is low (timing is outside detection window), AND gate 23 may be disabled.

On the other hand, AND gate 22 may output a signal (refer to waveform (j) of FIG. 3) when output signal S1*a* (refer to waveform (h) of FIG. 3) is positioned out of detection window W (refer to waveform (b) of FIG. 3) generated by detection window generating circuit 28. However, when output signal S1*a* (refer to waveform (d) of FIG. 3) is positioned within detection window W generated by detection window generating circuit 28, AND gate 22 may not output a signal (refer to waveform (f) of FIG. 3). When the output W of detection window generating circuit 28 is high (timing within detection window), AND gate 22 may be disabled. When the output W of detection window generating circuit 28 is low (timing is outside detection window), AND gate 22 may be enabled.

When an output of AND gate 23 (refer to waveform (e) of FIG. 3) goes high, OR gate 23 may apply a high logic level to load terminal LD of disagreement counter 25. With a high logic level applied to load terminal LD, disagreement counter 25 may load a load value 25*a* as an initial value as illustrated in waveform (g) of FIG. 3.

In this example, disagreement counter 25 may increment the stored value when AND gate 22 applies a logic high level to enable terminal EN of disagreement counter. As illustrated in waveform (k) of FIG. 3, when an output of AND gate 22 goes high, disagreement counter 25 may increment a stored value N.

Therefore, disagreement counter 25 may continue to count the output pulses from AND gate 22. However, when AND gate 23 provides a high output or ripple carry terminal RC of disagreement counter 25 provides a high output, OR gate 24 may apply a high logic level to load terminal LD of disagreement counter 25. In this way, load value 25*a* may be loaded into disagreement counter 25 and the count of output pulses from AND gate 22 may continue from this load value 25*a*.

Disagreement counter 25 may provide an output from ripple carry terminal RC having a high logic level when the count value becomes a maximum.

The output from ripple carry terminal RC may also be applied to a clear terminal CLR of clock counter 27 through OR gate 27. In this way, clock counter 27 may be cleared when the output of ripple carry terminal RC becomes a logic high level.

Then, upon clearing the count value of clock counter 27, detection window generating circuit 28 may generate a new detection window W essentially at a position where the latest timing signal from pulse width changing circuit 21 is centered.

In this way, the above operation may be repeated using the new detection window W.

Referring now to FIG. 2, in synchronization protecting circuit 11, clock counter 27 may be reset when timing signal S1*a* is positioned out of detection window W for a predetermined successive number of times. Clock counter 27 may operate synchronously with post-stage system clock C2.

However, when timing signal S1*a* is positioned within the detection window W even once, disagreement counter 25 may load the value of load value 25*a* as an initial value. This may be done as soon as timing signal S1*a* is detected within detection window W. However, clock counter 27 may not be reset until the count value of disagreement counter 25 reaches a maximum count value. As a result, during this period of time, first timing signal S1 that is synchronous with pre-stage system clock C1 may be synchronously protected.

Therefore, in a case where first timing signal S1, that is synchronous with a pre-stage system clock C1, is transferred from a pre-stage circuit 13 to a post-stage circuit 14 that may operate at a different system clock frequency, the first timing signal S1 may be set to the vicinity of the center of a screen due to the video signal in pre-stage circuit 13. Pre-stage circuit 13 and post-stage circuit 14 may be video signal processing circuits having different system clock frequencies. In this way, influence of the instability of the AFC of pre-stage circuit 13 and a timing shift due to a head change-over when pre-stage circuit 13 is a VTR, or the like, may be reduced or eliminated.

As a result, because second timing signal S2 that is synchronous with post-stage system clock C2 may be stably generated by timing signal generating circuit 12, a disturbance or distortion of a picture on a screen due to a difference in system clock frequency affecting a video signal in post-stage circuit 14 may be reduced or eliminated.

In the embodiments, synchronization protecting circuit 11 may be designed to generate signal S3 that may be translated to the timing of post-stage system clock C2 by disagreement counter 25 and clock counter 27 with the use of a detection window W generated by detection window generating circuit 28. However, the present invention is not limited to the above structure and may be applied to another structure so that signal S3 is translated or transferred to a timing of a post-stage system clock or timing signal generating circuit 12 may generate a second timing signal S2 directly.

As described above, according to the embodiments, a first timing signal may be synchronous with a pre-stage system clock and may be transferred to a post-stage video signal processing circuit. The post-stage video signal processing circuit may have a post-stage system clock frequency that is different from a pre-stage system clock frequency. The first timing signal may be set to a vicinity of a center of a screen due to a video signal in a pre-stage video signal processing circuit. In this way, a timing signal transferred to the post-stage video signal processing circuit may have a reduced influence on an instability of an AFC of the pre-stage video signal processing circuit and a time shift due to a head change-over when the pre-stage circuit is a VTR, or the like. Furthermore, the influence on an instability of an AFC of the pre-stage video signal processing circuit and a time shift due to a head change-over when the pre-stage circuit is a VTR, or the like, may be eliminated.

As a result, because the second timing signal synchronous with the post-stage system clock is stably generated, a disturbance or distortion of a video on a screen due to a difference in system clock frequency affecting a video signal in the post-stage circuit may be reduced or eliminated.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A timing signal transferring circuit coupled between a first video signal processing circuit and a second video signal processing circuit wherein the first video signal processing circuit has a first system clock and the second video signal processing circuit has a second system clock and the first system clock has a different frequency than the second system clock, comprising:
   an input terminal coupled to receive a first timing signal from the first video signal processing circuit that is essentially synchronous with the first system clock and is set to the vicinity of a center of a screen by a video signal;
   an output terminal coupled to provide a second timing signal to the second video signal processing circuit that is essentially synchronous with the second system clock and generated on the basis of the first tinting signal;
   a synchronization protecting circuit that subjects the first timing signal transferred from the first video signal processing circuit to synchronous protection with the second system dock as an operation clock; and
   a timing signal generating circuit that generates a second timing signal essentially synchronous with the second s stem clock on the basis of the first timing signal and the second system clock to transfer the second timing signal to the second video signal processing circuit.

2. The timing signal transferring circuit according to claim 1, wherein:
   the synchronization protecting circuit translates the first timing signal to a translated signal that is essentially synchronous with the second system clock.

3. The timing signal transferring circuit according to claim 2, wherein:
   the synchronization protecting circuit includes a clock counter that provides a clock counter signal that is essentially synchronous with the second system clock.

4. The timing signal transferring circuit according to claim 3, wherein:
   the timing signal generating circuit generates the second timing signal on the basis of at least the translated signal.

5. The timing signal transferring circuit according to claim 1, wherein:
   the synchronization protecting circuit conducts the synchronous protection of the first timing signal by using a detection window.

6. A timing signal transferring circuit, comprising:
   a synchronization protecting circuit coupled to receive a first timing signal that is essentially synchronous with a first system clock and generates a synchronization protecting circuit output signal; and
   a timing signal generating circuit coupled to receive the synchronization protecting circuit output signal and generate a second timing signal that is essentially synchronous with a second system clock wherein the first system clock has a different frequency than the second system clock wherein the synchronization protecting circuit detects whether the first timing signal has a predetermined logic level inside a detection window.

7. The timing signal transferring circuit according to claim 6, wherein:
   the synchronization protecting circuit is coupled to receive the second system clock.

8. The timing signal transferring circuit according to claim 7, wherein:
   the synchronization protecting circuit includes a detection window generating circuit coupled to receive the synchronization protecting circuit output signal and provide the detection window essentially centered at a timing of the second timing signal.

9. The timing signal transferring circuit according to claim 8, wherein:
   the synchronization protecting circuit further includes a disagreement counter that is incremented when the first timing signal has a predetermined logic level out of the detection window.

10. The timing signal transferring circuit according to claim 8, wherein:
    the synchronization protecting circuit further includes a disagreement counter that is reset when the first timing signal has a predetermined logic level within the detection window.

11. The timing signal transferring circuit according to claim 8, wherein:
    the detection window is shifted after a consecutive predetermined number of times the first timing signal has a predetermined logic level outside of the detection window.

12. The timing signal transferring circuit according to claim 6, wherein:
    the first system clock is used for a first video processing circuit and the second system clock is used for a second video processing circuit.

13. A timing signal transferring circuit, comprising:
    a synchronization protecting circuit coupled to receive a first timing signal that is essentially synchronous with a first system clock and that provides a second timing signal that is essentially synchronous with a second system clock wherein the first system clock has a different frequency than the second system and the synchronization protecting circuit detects whether the first timing signal has a predetermined logic level inside a detection window.

14. The timing signal transferring circuit according to claim 13, wherein:
    the first timing signal is provided by a first video signal processing circuit operating from the first system clock and the second timing signal is provided to a second video signal processing circuit operating from the second system clock.

15. The timing signal transferring circuit according to claim 13, wherein:
    the first system clock is set to the vicinity of a center of a screen.

16. The timing signal transferring circuit according to claim 13, wherein:
    the synchronization protecting circuit includes a detection window generating circuit coupled to receive the second timing signal and provide the detection window essentially centered at a timing of the second timing signal.

17. The timing signal transferring circuit according to claim 13, wherein:
    the synchronization protecting circuit includes a first counter that is reset to an initial count value if the first timing signal has a predetermined logic level within a detection window.

18. The timing signal transferring circuit according to claim 13, wherein:
the synchronization protecting circuit includes a pulse width changing circuit coupled to receive the firs t timing signal and provide a modified pulse width signal.

* * * * *